United States Patent
Kondo et al.

(10) Patent No.: US 10,679,766 B2
(45) Date of Patent: *Jun. 9, 2020

(54) PRINTED CIRCUIT BOARD

(71) Applicant: CANON KABUSHIKI KAISHA, Tokyo (JP)

(72) Inventors: Takuya Kondo, Hiratsuka (JP); Shoji Matsumoto, Fujisawa (JP); Seiji Hayashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/924,897

(22) Filed: Mar. 19, 2018

(65) Prior Publication Data

US 2018/0211743 A1     Jul. 26, 2018

Related U.S. Application Data

(63) Continuation of application No. 14/688,881, filed on Apr. 16, 2015, now Pat. No. 9,953,743.

(30) Foreign Application Priority Data

Apr. 18, 2014   (JP) .................................. 2014-086484

(51) Int. Cl.

| H05K 7/10 | (2006.01) |
|---|---|
| H05K 7/12 | (2006.01) |
| H01B 3/40 | (2006.01) |
| H01L 23/498 | (2006.01) |
| H05K 3/28 | (2006.01) |
| H05K 1/02 | (2006.01) |
| H05K 3/34 | (2006.01) |

(52) U.S. Cl.
CPC ......... *H01B 3/40* (2013.01); *H01L 23/49816* (2013.01); *H01L 23/49827* (2013.01); *H05K 3/284* (2013.01); *H01L 2224/16225* (2013.01); *H01L 2224/73204* (2013.01); *H05K 1/0231* (2013.01); *H05K 3/3436* (2013.01); *H05K 2201/0209* (2013.01); *H05K 2201/10977* (2013.01)

(58) Field of Classification Search
CPC ............ H01B 3/40; H01L 2224/16225; H01L 2224/73204; H01L 23/49816; H01L 23/49827; H05K 1/0231; H05K 2201/0209; H05K 2201/10977; H05K 3/284; H05K 3/3436
See application file for complete search history.

(56) References Cited

U.S. PATENT DOCUMENTS

| 9,553,040 B2 * | 1/2017 | Hsu ................... H01L 23/49811 |
| 9,953,743 B2 * | 4/2018 | Kondo .............. H01L 23/49816 |

(Continued)

*Primary Examiner* — Yuriy Semenenko
(74) *Attorney, Agent, or Firm* — Canon U.S.A., Inc. I.P. Division

(57) ABSTRACT

A printed circuit board has a printed wiring board and a semiconductor package mounted on the printed wiring board. The printed wiring board and the semiconductor package are connected with a plurality of solder balls. An underfill material covering the plurality of solder balls is filled between the printed wiring board and the semiconductor package. The underfill material has a relative dielectric constant of 8.6 or more and 54.4 or less. Thus, crosstalk noise generated in wiring in the out-of-plane direction is reduced without increasing the mounting area.

19 Claims, 13 Drawing Sheets

(56) References Cited

U.S. PATENT DOCUMENTS

| | | | | |
|---|---|---|---|---|
| 2010/0051340 A1* | 3/2010 | Yang | ................. | H01B 1/24 |
| | | | | 174/260 |
| 2011/0001233 A1* | 1/2011 | Iwase | ................. | H01L 21/563 |
| | | | | 257/737 |
| 2011/0291197 A1* | 12/2011 | Wu | ................. | H01L 21/823871 |
| | | | | 257/368 |
| 2012/0267779 A1* | 10/2012 | Lin | ................. | H01L 24/11 |
| | | | | 257/737 |
| 2014/0116765 A1* | 5/2014 | Hossain | ................. | H05K 3/42 |
| | | | | 174/260 |

* cited by examiner

PRINTED CIRCUIT BOARD

CROSS REFERENCE TO RELATED APPLICATIONS

The present application is a continuation of U.S. patent application Ser. No. 14/688,881, filed on Apr. 16, 2015, which claims priority from Japanese Patent Application No. 2014-086484, filed Apr. 18, 2014, which is hereby incorporated by reference herein in its entirety.

BACKGROUND OF THE INVENTION

Field of the Invention

The present invention relates to a printed circuit board in which a printed wiring board and a semiconductor package are connected with connection terminals.

Description of the Related Art

In order to realize a further reduction in size and higher functionality of electronic equipment, a printed wiring board has been demanded to increase the wiring density and increase the speed of circuit operation. In order to increase the density of the printed wiring board, the wiring width and the wiring gap decrease in signal lines (pattern) extending in the in-plane direction (horizontal direction to the surface of the printed wiring board) of the printed wiring board. In via conductors formed in vias forming wiring in the out-of-plane direction (vertical direction to the surface of the printed wiring board) of the printed wiring board and connection terminals (for example, solder balls) connecting the printed wiring board and a semiconductor package substrate, the pitch becomes narrower and the diameter becomes smaller.

On the other hand, in order to increase the speed of circuit operation, not only the signal cycle but the transition time required for switching the logic level of signals becomes shorter in the waveform of electric signals which propagate through a printed circuit board.

The increase in density and the increase in speed of circuit operation of a printed circuit board cause turbulence of a signal waveform due to electromagnetic coupling from an adjacent signal, i.e., a problem of signal integrity which is so-called actualization of crosstalk noise.

In general, in the signal waveform, a noise margin to a threshold value voltage is specified in a stable section of the logic level. However, it has become difficult to secure the noise margin due to superimposition of crosstalk noise. Heretofore, a measure against the crosstalk noise has been taken for wiring (wiring length of about 10 [mm]) in the in-plane direction. However, the level of the crosstalk noise in the via conductors (signal vias) or the solder balls (wiring length of about 2 [mm]) forming the wiring in the out-of-plane direction is not negligible with respect to the noise margin.

As a former technique of reducing the crosstalk noise between the signal vias forming wiring in the out-of-plane direction, Japanese Patent Laid-Open No. 2005-340247 has proposed a method for disposing a via of a ground potential between signal vias close to each other.

However, when the method described in Japanese Patent Laid-Open No. 2005-340247 is applied to a structure in which signal vias have already been disposed at the smallest interval in terms of manufacturing, a problem has arisen in that the interval of the signal vias has been required to be extended, resulting in an increase in the mounting area.

The technique disclosed in Japanese Patent Laid-Open No. 2005-340247 is a technique for reducing the crosstalk in the signal vias and has not been able to reduce the crosstalk in the solder balls.

Then, the present invention aims at reducing crosstalk noise generated between connection terminals without increasing the mounting area.

SUMMARY OF THE INVENTION

A printed circuit board of the present invention has a printed wiring board and a semiconductor device mounted on the printed wiring board, a plurality of connection terminals which connect the printed wiring board and the semiconductor device and are disposed at intervals, and an underfill material which is filled between the printed wiring board and the semiconductor device to cover the plurality of connection terminals, in which the underfill material has a relative dielectric constant of 8.6 or more and 54.4 or less.

According to the present invention, inductive crosstalk between the connection terminals which is the main cause of the crosstalk between the connection terminals is reduced by capacitive crosstalk between the connection terminals due to the underfill material. Thus, the crosstalk noise generated between the connection terminals can be reduced without increasing the mounting area.

Further features of the present invention will become apparent from the following description of exemplary embodiments with reference to the attached drawings.

DESCRIPTION OF THE EMBODIMENTS

Figure 1:
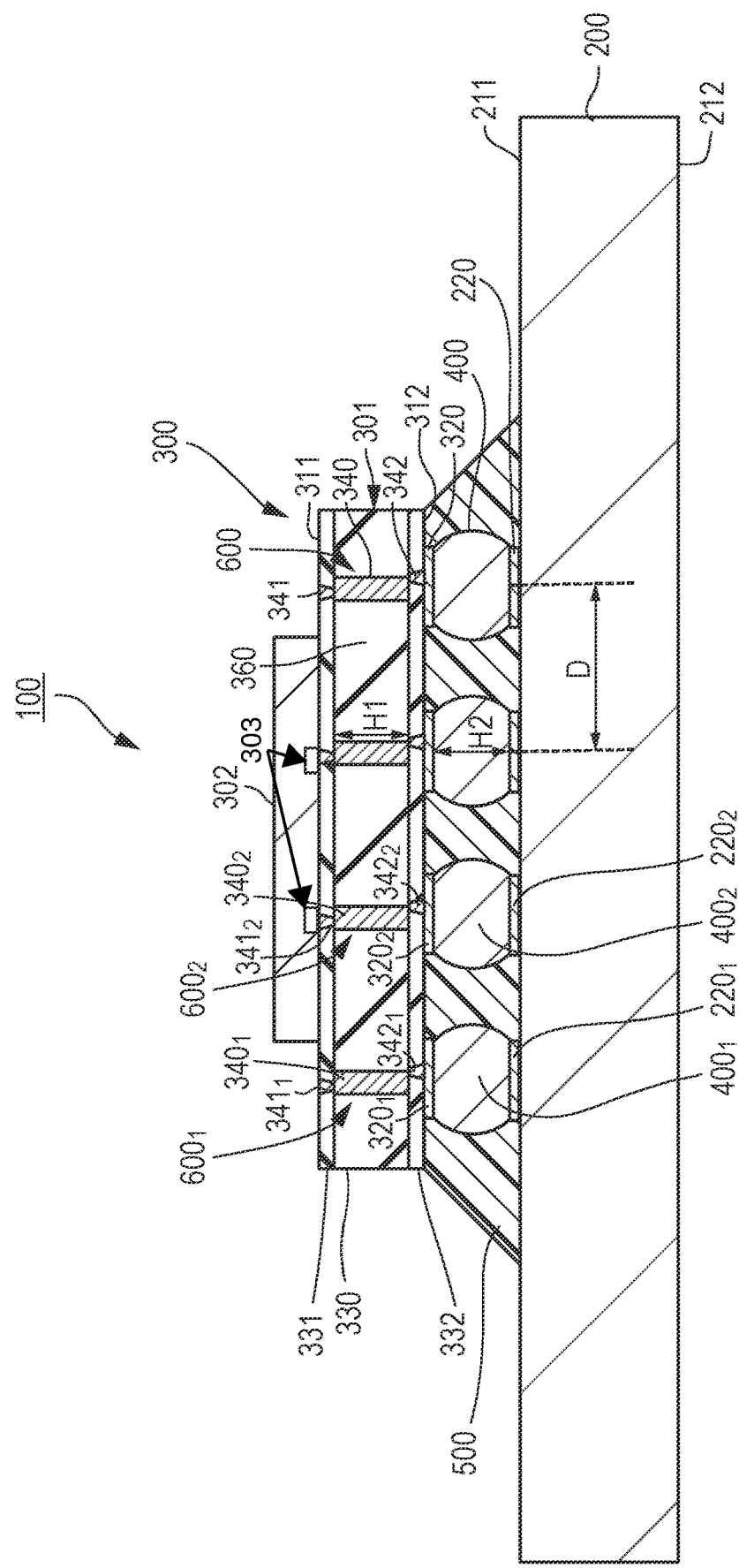
FIG. 1 is a cross sectional view schematically illustrating the schematic configuration of a printed circuit board according to an embodiment.

Hereinafter, an aspect for implementing the present invention is described in detail with reference to the drawings. FIG. 1 is a cross sectional view schematically illustrating the schematic configuration of a printed circuit board according to an embodiment of the present invention. A printed circuit board 100 has a printed wiring board 200, such as a mother board, and a semiconductor package 300 which is a semiconductor device mounted on the printed wiring board 200. The printed wiring board 200 and the semiconductor package 300 (specifically a package substrate 301) are connected with a plurality of solder balls 400 which are connection terminals.

The semiconductor package 300 is a BGA (Ball Grid Array) type semiconductor package in this embodiment. The semiconductor package 300 has a package substrate 301 which is an interposer and a semiconductor chip 302 mounted on the package substrate 301. The semiconductor chip 302 is mounted on one surface 311 of a pair of surfaces 311 and 312 of the package substrate 301.

On a surface 312 facing the printed wiring board 200 of the pair of surfaces 311 and 312 of the package substrate 301, a plurality of pads 320 are arranged at intervals in the shape of an array (lattice shape).

On one surface 211 of a pair of surfaces 211 and 212 of the printed wiring board 200, i.e., a surface 211 facing the surface 312 of the package substrate 301, a plurality of pads 220 having the same number and the same arrangement as those of the pads 320 of the package substrate 301 are formed. Each pad 320 of the package substrate 301 and each pad 220 of the printed wiring board 200 are bonded with the solder ball 400.

This embodiment describes a case where the connection terminals are the solder balls 400 but the present invention is not limited thereto. The connection terminals may be, for example, conductor balls formed with copper, gold, silver, and the like which do not melt by heating in a bonding process, such as a reflow process, or resin balls whose surface is plated with a conductor. In that case, these balls and the pads 220 and 320 are bonded by soldering.

Herein, the package substrate 301 is a laminated substrate having four conductor layers (layer on which a conductor pattern is disposed) in which a core layer 330 and buildup layers 331 and 332 disposed on both surfaces of the core layer 330 are provided. The core layer 330 is an insulator layer (dielectric layer) formed with an insulator 360 containing a glass epoxy resin (relative dielectric constant of 4.3). The buildup layers 331 and 332 are also insulator layers (dielectric layers) formed with a glass epoxy resin (relative dielectric constant of 4.3). Conductor layers are disposed between the core layer 330 and the buildup layers 331 and 332 and on the outer surfaces of the buildup layers 331 and 332, and thus the package substrate 301 is a laminated substrate having four conductor layers.

In the core layer 330, through-hole vias are formed for signals. Via conductors 340 are formed in the through-hole vias. In the buildup layer 331, vias connected to the through-hole vias are formed. In the vias, via conductors 341 electrically connected to the via conductors 340 are formed. The via conductors 341 are connected to a wiring pattern (not illustrated) formed on the surface 311. To the wiring pattern (not illustrated), signal terminals 303 of the semiconductor chip 302 are electrically connected by wire bonding, solder balls, and the like, for example.

In the buildup layer 332, vias connected to the through-hole vias are formed. In the vias, via conductors 342 electrically connected to the via conductors 340 are formed. The via conductors 342 are electrically connected to the pads 320 directly or through the wiring pattern (not illustrated).

The configuration of the package substrate 301 is not limited thereto. For example, the package substrate 301 may be constituted by only the buildup layer or only the core layer. Any configuration may be acceptable insofar as the plurality of pads 320 are disposed on the surface 312.

In the above-described configuration, the printed circuit board 100 has a plurality of signal lines 600 connected to the signal terminals 303 of the semiconductor chip 302 and extending in the out-of-plane direction in which signals are transmitted. FIG. 1 illustrates a signal line (first signal line) $600_1$ and a signal line (second signal lines) $600_2$ adjacent to the signal line $600_1$. The semiconductor chip 302 can communicate (sending or receiving of signals) with a semiconductor chip (not illustrated) of another semiconductor package (not illustrated) mounted on the printed wiring board 200 through the signal lines $600_1$ and $600_2$.

The signal line $600_1$ is wiring extending in the out-of-plane direction having a via conductor $341_1$, a via conductor $340_1$, a via conductor $342_1$, a pad $320_1$, a solder ball $400_1$, and a pad $220_1$, which are connected in series. The signal line $600_2$ is wiring extending in the out-of-plane direction having a via conductor $341_2$, a via conductor $340_2$, a via conductor $342_2$, a pad $320_2$, a solder ball $400_2$, and a pad $220_2$, which are connected in series.

Herein, the out-of-plane direction is the vertical direction to the surface of the package substrate 301 or the printed wiring board 200. The in-plane direction is the horizontal direction to the surface of the package substrate 301 or the printed wiring board 200.

Between the semiconductor package 300 and the printed wiring board 200, specifically, between the surface 312 of the package substrate 301 and the surface 211 of the printed wiring board 200, a gap is formed by the solder balls 400. Between the surface 312 and the surface 211, an underfill material 500 is filled (injected). Thus, each solder ball 400 is covered with the underfill material 500. The underfill material 500 has epoxy resin, e.g., a bisphenol F type epoxy resin having a relative dielectric constant of 3.8, as the base material.

Figure 12:
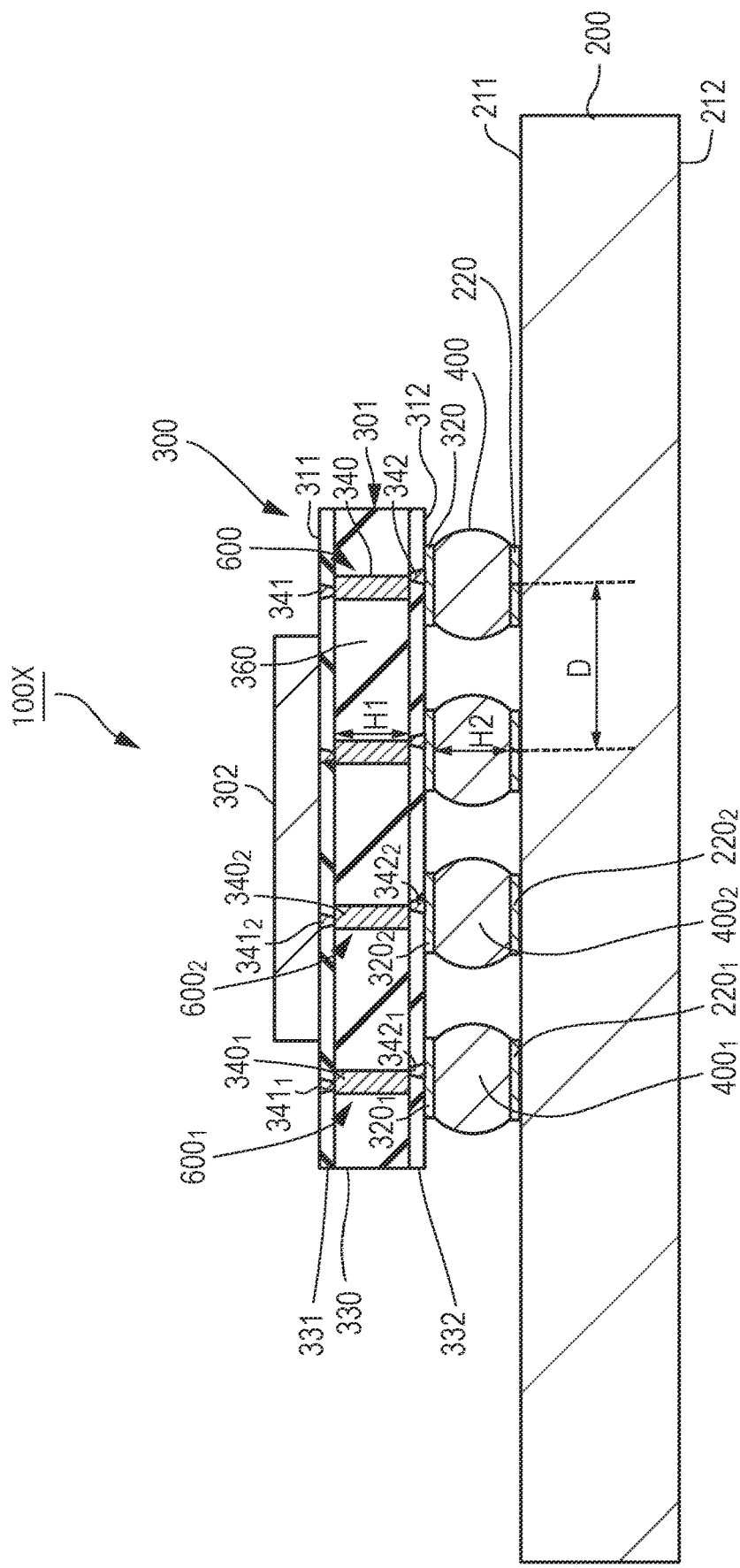
FIG. 12 is a cross sectional view schematically illustrating the schematic configuration of a printed circuit board of Comparative Examples.

First, the generation mechanism of the crosstalk noise in the signal lines 600 in the out-of-plane direction is described with reference to Comparative Examples. FIG. 12 is a cross sectional view schematically illustrating the schematic configuration of a printed circuit board 100 of Comparative Examples. The printed circuit board 100 has a structure in which the underfill material 500 is removed from the printed circuit board 100 of FIG. 1.

It has been found that, in the printed circuit board 100 of Comparative Examples, the generation amount of crosstalk noise per unit length generated in wiring 600 in the out-of-plane direction is larger than that in wiring in the in-plane direction on the printed wiring board 200.

When an electric signal is input immediately before the via conductor $341_1$ of the signal line $600_1$ in a state where a signal is not input to the signal line $600_2$, electromotive force, so-called crosstalk noise, can be observed immediately after the pad $220_2$ of the signal line $600_2$.

Figure 13:
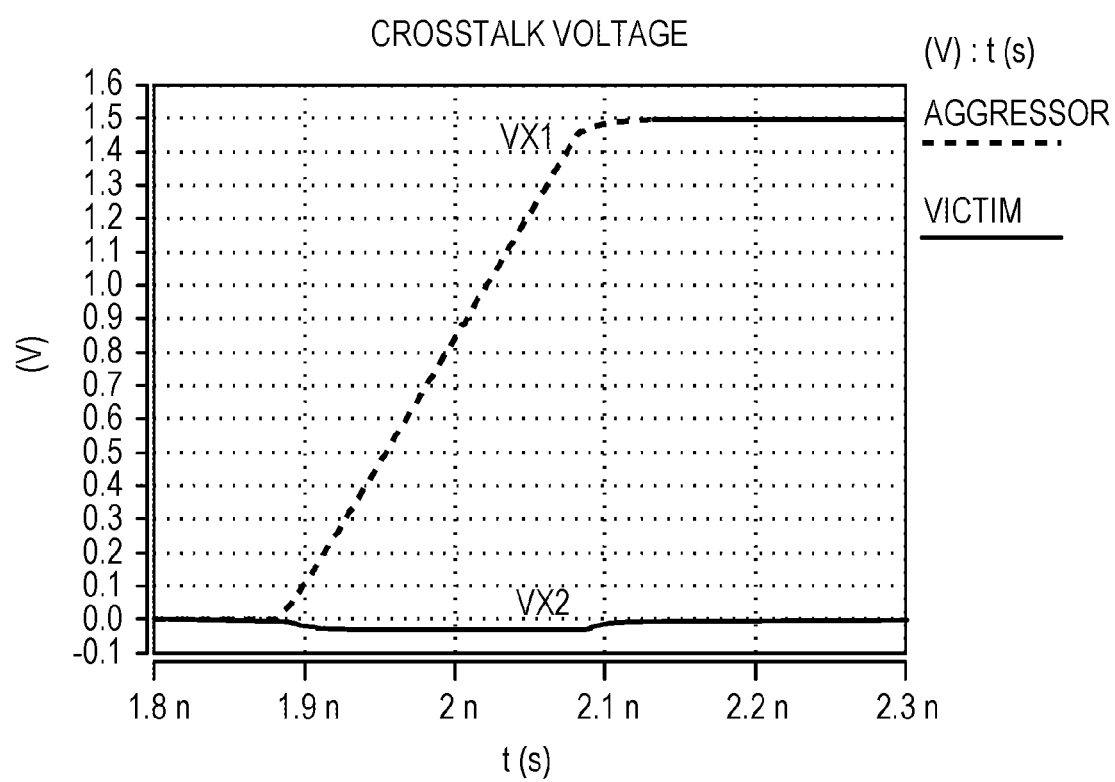
FIG. 13 is a graph of the simulation results showing the generation state of crosstalk noise in Comparative Examples.

FIG. 13 shows a waveform VX1 observed immediately after the pad $220_1$ of the signal line $600_1$ and a waveform VX2 observed immediately after the pad $220_2$ of the signal lines $600_2$. The potential of the VX2 is originally still 0 but fluctuates to a negative potential due to the crosstalk noise.

This crosstalk noise results from the electromagnetic coupling of the signal line $600_1$ and the signal line $600_2$. The electromagnetic coupling is classified into a component generated due to the interference (coupling) of the electric filed between the signal line $600_1$ and the signal line $600_2$ (crosstalk due to capacitive coupling) and a component generated due to the interference (coupling) of the electric filed between the signal line $600_1$ and the signal line $600_2$ (crosstalk due to inductive coupling).

When a step pulse signal of a positive potential flows into the signal line $600_1$, crosstalk noise generated in the signal line $600_2$ under the influence of an electric field appears as a pulse having a positive amplitude. On the other hand, crosstalk noise generated in the signal line $600_2$ under the influence of a magnetic field appears as a pulse having a negative amplitude.

In actual, the phenomenon in which crosstalk noise is generated under the influence of an electric field and the phenomenon in which a crosstalk noise is generated under the influence of a magnetic field simultaneously occur. Therefore, the amplitude of the final crosstalk noise is obtained by adding a positive amplitude generated under the influence of an electric field and a negative amplitude generated under the influence of a magnetic field, and then canceling the influence with each other.

The crosstalk noise having a positive amplitude generated under the influence of an electric field is proportional to the size of capacitive coupling between the signal line $600_1$ and the signal line $600_2$. The capacitive coupling has correlation in the relative dielectric constant around the signal conductors, i.e., between the signal line $600_1$ and the signal line $600_2$.

The crosstalk noise having a negative amplitude generated under the influence of a magnetic field is proportional to the size of inductive coupling between the signal line $600_1$ and the signal line $600_2$. The inductive coupling has correlation in the relative magnetic permeability around the signal conductors, i.e., between the signal line $600_1$ and the signal line $600_2$.

The capacitive coupling and the inductive coupling have correlation in the ground around the signal conductors, the arrangement state of the other signal conductors, and the width of the signal conductors.

In general, with respect to wiring on a printed wiring board to be mounted on electronic equipment, a surface conductor through which a feedback current referred to as a ground plain flows is present in an inner layer. However, in the via conductors 340 and the solder balls 400, such a surface conductor through which a feedback current flows is not be present and the via conductors 340 or the solder balls 400 are prepared also for a ground conductor through which a feedback current flows, similarly as signals.

As to the solder balls (connection terminals) 400 bonded to the pads 220 of the package substrate 301, one via conductor 340 of the package substrate 301 is provided corresponding to one solder ball 400 serving as a signal terminal. The number of the solder balls 400 (pads 320) serving as ground terminals is limited giving priority to the arrangement of the solder balls 400 (pads 320) serving as signal terminals. Therefore, the number of the solder balls 400 (pads 320) serving as ground terminals is smaller than the number of the solder balls 400 (pads 320) serving as signal terminals.

Therefore, the electromagnetic coupling with another signal line $600_2$ of the signal line $600_1$ is likely to be higher than the coupling with a ground conductor. In particular, the inductive coupling is likely to be influenced by the presence or absence of the ground conductor and coupling in a direction where the ground conductor is not present has influence in a distance about 5 times the signal conductor width.

In this embodiment, the crosstalk noise generated by the inductive coupling resulting from the structure of the via conductors $340_1$ and $340_2$ is larger than the crosstalk generated by the capacitive coupling and the inductive coupling is dominant in the crosstalk noise generated in the via conductors $340_1$ and $340_2$. The circumference of the via conductors $340_1$ and $340_2$ is covered with a glass epoxy resin having a relative dielectric constant of 4.3.

On the other hand, in the solder balls $400_1$ and $400_2$, the circumference thereof is air having a relative dielectric constant of 1. Therefore, the capacitive coupling becomes weak as compared with that in the via conductors $340_1$ and $340_2$ but the same degree of the inductive coupling is generated. Therefore, a crosstalk noise in which the inductive coupling is more dominant than that in the via conductors $340_1$ and $340_2$ is generated.

In order to improve the connection reliability of the package substrate 301 and the printed wiring board 200, a resin referred to as an underfill material has been injected between the package substrate 301 and the printed wiring board 200 in some cases. In this case, the circumference of the solder ball 400 also has been formed with the underfill material and the underfill material generally has been formed with epoxy resin and has had a relative dielectric constant of about 3 to 5. With such a relative dielectric constant, the crosstalk noise generated by the inductive coupling in the out-of-plane direction has not been able to be sufficiently reduced. Therefore, between the signal line $600_1$ and the signal line $600_2$, particularly between the solder balls $400_1$ and $400_2$, a crosstalk noise in which the inductive coupling is dominant has been generated.

From the above description, the generation of the crosstalk noise in the signal lines $600_1$ and $600_2$ in the out-of-plane direction was caused due to imbalance between the inductive coupling and the capacitive coupling resulting from the structures of the via conductors $340_1$ and $340_2$ and the solder balls $400_1$ and $400_2$. In particular, crosstalk noise having a strong negative amplitude has been generated due to the inductive coupling between the solder balls $400_1$ and $400_2$.

Accordingly, in order to cancel the negative amplitude of the crosstalk noise resulting from the inductive coupling between the solder balls $400_1$ and $400_2$, the underfill material 500 is filled between the package substrate 301 and the printed wiring board 200 in this embodiment.

The underfill material 500 has a relative dielectric constant higher than that of air and generally-used underfill materials (relative dielectric constant of 3 to 5).

Therefore, capacitive coupling which cancels the inductive coupling generated between the solder balls 400 and 400 can be produced without increasing the mounting area, the crosstalk noise generated between the signal lines 600 and 600 can be reduced, and a noise margin can be secured.

When the relative dielectric constant of the underfill material 500 is excessively high, the crosstalk noise of the positive amplitude become excessively high. Therefore, the relative dielectric constant of the underfill material 500 has a proper range. Hereinafter, the range is specifically described.

Example 1

Results obtained by performing simulation for the printed circuit board 100 illustrated in FIG. 1 are described. First, the conditions under which the simulation was performed are described. The height (length) H1 of the via conductor 340 of the package substrate 301 was set to 0.6 [mm], the pitch D of the solder balls 400 and 400 was set to 0.5 [mm], and the height H2 of the solder balls 400 was set to 0.3 [mm]. For the insulator 360 around the via conductors 340, a glass epoxy resin (relative dielectric constant of 4.3) was used and the slew rate of a signal to be transmitted was set to 7.5 [V/nsec].

As a method for reducing the crosstalk noise in the signal lines $600_1$ and $600_2$ in the out-of-plane direction, an underfill material 500 having a dielectric constant higher than that of generally used underfill materials (relative dielectric constant of 3 to 5) was filled between and around the solder balls 400. crosstalk noise having a positive amplitude due to capacitive coupling is increased between the solder balls $400_1$ and $400_2$ by the underfill material 500. Thus, crosstalk noise having a negative amplitude due to inductive coupling in the via conductors $340_1$ and $340_2$ and the solder ball $400_1$ and $400_2$ is canceled.

Figure 2:
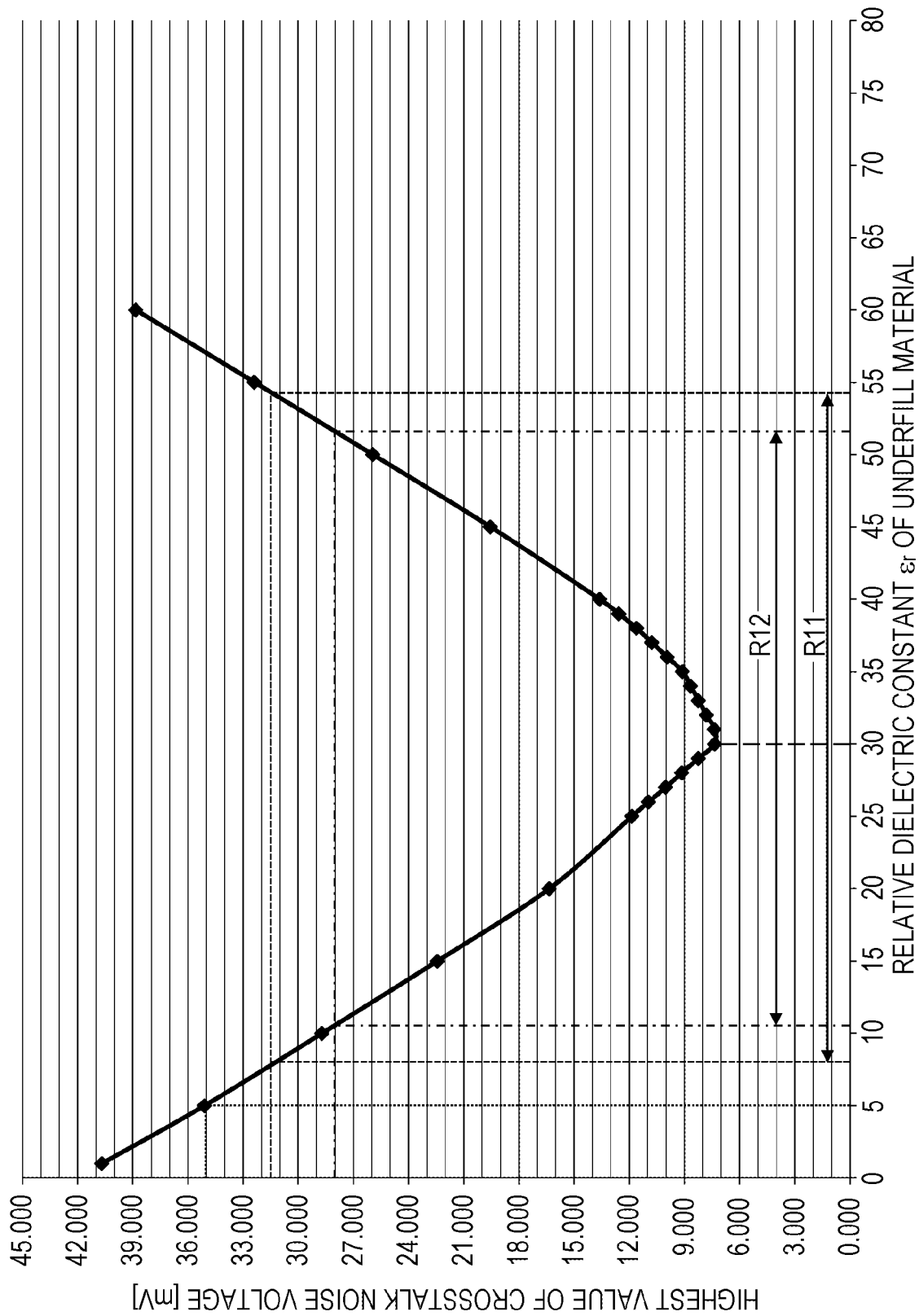
FIG. 2 is a graph showing the relationship between the relative dielectric constant of an underfill material and the absolute value of the highest fluctuation voltage of a crosstalk noise voltage generated in signal lines in Example 1.

FIG. 2 is a graph showing simulation results of the relationship between the relative dielectric constant of the underfill material 500 and the absolute value of the highest fluctuation voltage of a crosstalk noise voltage generated in the signal line $600_2$ in Example 1.

In Example 1, cross sections in the signal transmission direction of the via conductors 340 and the solder balls 400 were analyzed using XFX of Mentor Graphics Corp. as an electrostatic magnetic field analysis tool to model the resistance, the capacity, and the inductance per unit length. Then, a step pulse was injected into the model created in a circuit simulator HSPICE of Synopsys, Inc. to perform simulation of a crosstalk noise voltage.

FIG. 2 showed that the crosstalk due to capacitive coupling further increased with an increase in the relative dielectric constant of the underfill material 500. The crosstalk due to inductive coupling can cancel the crosstalk due to capacitive coupling.

At a relative dielectric constant of 30, all the crosstalk noises having a negative amplitude due to inductive coupling generated in the via conductors 340 and the solder balls 400 are canceled by the crosstalk noise having a positive amplitude due to capacitive coupling.

When the relative dielectric constant of the underfill material 500 is larger than 30, the crosstalk noise having a positive amplitude due to capacitivity remains even when cancel by the crosstalk noise having a negative amplitude due to inductive coupling generated in the via conductors 340 and the solder balls 400. Therefore, the crosstalk noise having a positive amplitude notably appears.

Figure 3:
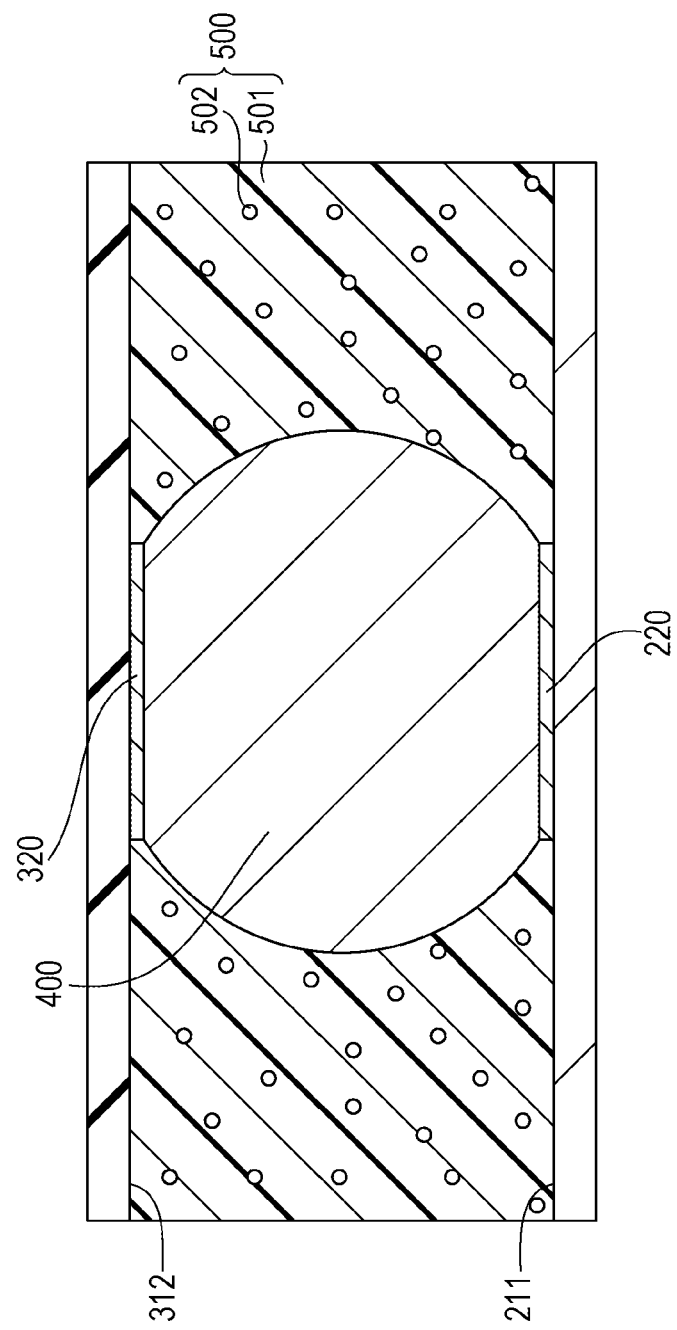
FIG. 3 is a cross sectional view illustrating the vicinity of a solder ball of a printed circuit board.

FIG. 3 is a cross sectional view illustrating the vicinity of the solder balls 400 of the printed circuit board 100. As illustrated in FIG. 3, the underfill material 500 has a base material 501 and high dielectric constant materials 502 mixed into the base material 501 and having a dielectric constant higher than that of the base material 501. More specifically, a composition in which the relative dielectric constant of the underfill material 500 is higher than that of generally used underfill materials (relative dielectric constant of 3 to 5) is obtained by mixing the high dielectric constant materials 502 as a filler into the base material 501.

As an example, the base material 501 contains epoxy resin and the high dielectric constant materials 502 contain at least one of barium titanate, titanium oxide, strontium titanate, and calcium zirconate.

The highest value of the relative dielectric constant of generally used underfill materials is about 5.0. FIG. 2 shows that the crosstalk noise voltage when the relative dielectric constant is 5.0 is 35.1 [mV] and a range R11 of the relative dielectric constant of the underfill material 500 in which the noise reduction effect is 10% or more, i.e., the crosstalk noise voltage is 31.6 [mV] or less, is 7.8 or more and 54.4 or less.

A range R12 of the relative dielectric constant of the underfill material 500 in which the noise reduction effect is 20% or more i.e., the crosstalk noise voltage is 28.1 [mV] or less, to generally used underfill materials is 10.5 or more and 51.7 or less as shown in FIG. 2.

The relative dielectric constant of the underfill material 500 at which the noise reduction effect is the highest in the structure of Example 1 is 30 as shown in FIG. 2.

Figure 4:
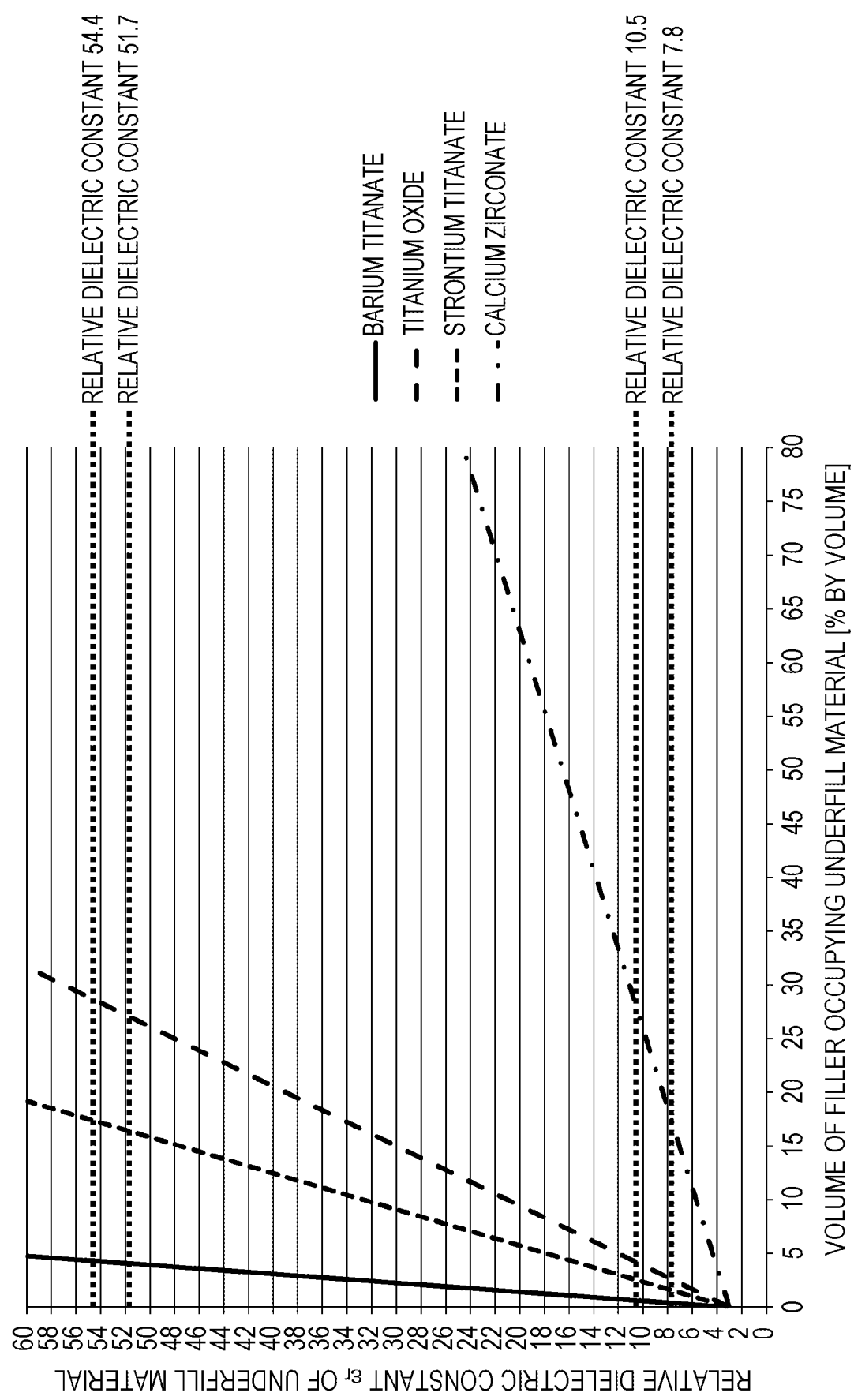
FIG. 4 is a graph showing the relative dielectric constant of the underfill material to the volume ratio of a high dielectric constant material in Example 1.

FIG. 4 is a graph showing the relative dielectric constant of the underfill material 500 to the volume ratio of the high dielectric constant materials 502 in the underfill material 500. FIG. 4 shows the case where epoxy resin (relative dielectric constant of 3) was used for the base material 501 and a simple substance of barium titanate, titanium oxide, strontium titanate, calcium zirconate was mixed as the high dielectric constant materials 502 into the base material 501.

In general, the relative dielectric constant of the mixed material is determined based on the relative dielectric constant and the volume ratio of each substance contained in the mixed material. Therefore, an example of a composition which realizes the range R11 (7.8 or more and 54.4 or less) of the relative dielectric constant of the underfill material 500 was as follows from the results of FIG. 4. In this case, epoxy resin (relative dielectric constant of 3) was used for the base material 501 and any one of barium titanate, titanium oxide, strontium titanate, and calcium zirconate was used for the high dielectric constant materials 502 to be mixed.

The volume ratio of barium titanate is 0.4% or more and 4.3% or less.

The volume ratio of titanium oxide is 2.7% or more and 28.6% or less.

The volume ratio of strontium titanate is 1.6% or more and 17.3% or less.

The volume ratio of calcium zirconate is 17.8% or more.

An example of a composition which realizes the range R12 (10.5 or more and 51.7 or less) of the relative dielectric constant of the underfill material 500 having a further noise reduction effect (20% or more noise reduction as compared with generally used underfill materials) was as follows. In this case, epoxy resin (relative dielectric constant of 3) was used for the base material 501 and any one of barium titanate, titanium oxide, strontium titanate, and calcium zirconate was used for the high dielectric constant materials 502 to be mixed.

The volume ratio of barium titanate is 0.6% or more and 4.1% or less.

The volume ratio of titanium oxide is 4.2% or more and 27.1% or less.

The volume ratio of strontium titanate is 2.5% or more and 16.4% or less.

The volume ratio of calcium zirconate is 27.8% or more.

From FIG. 4, as the composition of the underfill material 500 (relative dielectric constant of 30) having the highest noise reduction effect in the structure of Example 1, the following compositions 1 to 3 are mentioned.

Composition 1:
  Barium titanate (relative dielectric constant of 1200) 2.3% by volume
  Epoxy resin (relative dielectric constant of 3) 96.7% by volume
  Carbon black 1% by volume or less Composition 2:
  Titanium oxide (relative dielectric constant of 183) 15% by volume
  Epoxy resin (relative dielectric constant of 3) 84% by volume
  Carbon black 1% by volume or less Composition 3:
  Strontium titanate (relative dielectric constant of 300) 9.1% by volume
  Epoxy resin (relative dielectric constant of 3) 89.9% by volume
  Carbon black 1% by volume or less By filling (injecting) the underfill material 500 having a relative dielectric constant of 30 represented by these compositions 1 to 3 between and around the solder balls 400, crosstalk noise generated in the via conductors 340 and the solder balls 400 can be minimized.

Thus, crosstalk noise of a negative voltage generated due to inductive coupling between the solder balls 400 and 400 is canceled by the crosstalk noise of a positive voltage generated due to capacitive coupling between the solder balls 400 and 400 by the underfill material 500. Therefore, the underfill material 500 can reduce the crosstalk noise generated between the solder balls 400 and 400, specifically, between the wiring 600 and 600 in the out-of-plane direction, can be reduced without increasing the mounting area.

By using epoxy resin as the main component for the base material 501, the bonding between the solder balls 400 and the pads 220 and 320 can be effectively reinforced.

In particular, due to the fact that the high dielectric constant materials 502 contain barium titanate as the main component, the volume ratio of the high dielectric constant materials 502 to the underfill material 500 can be made small. Therefore, a reduction in the effect of reinforcing the bonding by the base material 501 can be suppressed.

Next, simulation was performed under the conditions where the relative dielectric constant of the underfill material 500 to be used in Example 1 was set to 30 and the relative dielectric constant of the underfill material was set to 5 as Comparative Example 1.

Figure 5:
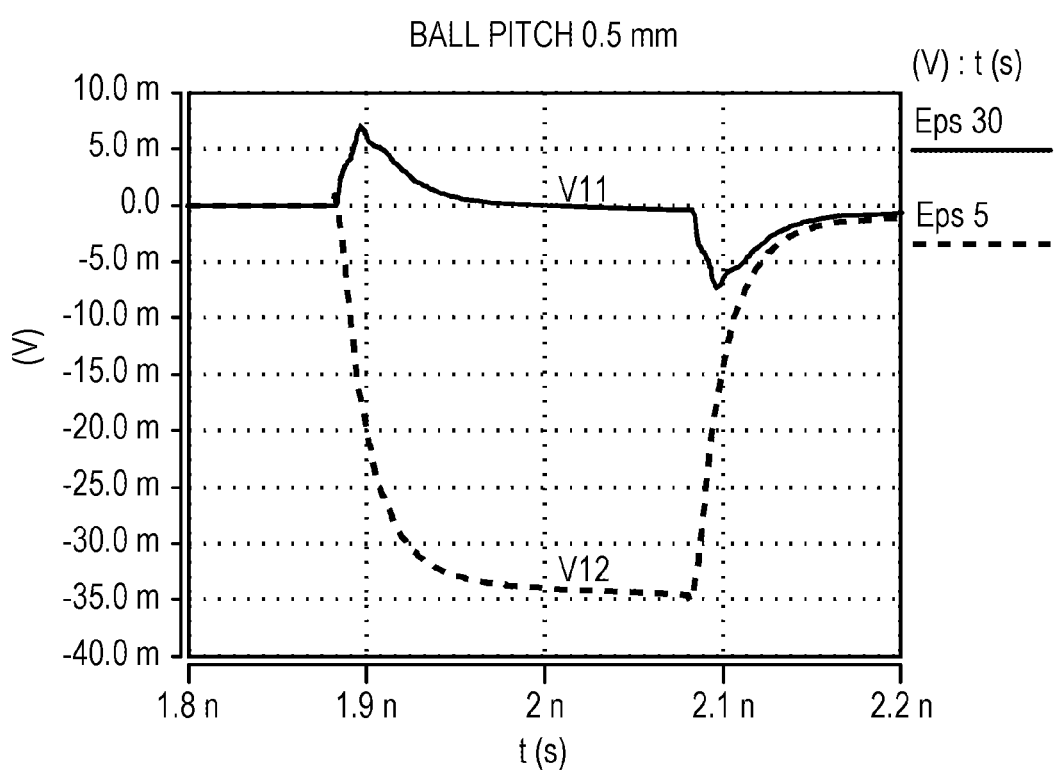
FIG. 5 is a voltage waveform chart showing crosstalk voltages in Example 1 and Comparative Example 1.

In the printed circuit board 100 of Example 1 and a printed circuit board of Comparative Example 1, a step pulse having a slew rate of 7.5 [V/nsec] and a voltage of 1.5 [V] was applied immediately before the via conductor $341_1$ with respect to the signal line $600_1$ of the package substrate 301. The crosstalk noise voltage on the wiring in the printed wiring board immediately after the solder ball $400_2$ in the signal line $600_2$ at this time is shown in FIG. 5. FIG. 5 is a voltage waveform chart showing the crosstalk noise voltages in Example 1 and Comparative Example 1. The solid line V11 represents the crosstalk noise voltage in Example 1 and the dotted lines V12 represent the crosstalk noise voltage in Comparative Example 1. In Comparative Example 1, a crosstalk noise voltage of 35.1 [mV] is generated but, in Example 1 in which the underfill material 500 having a relative dielectric constant of 30 was injected, the crosstalk voltage can be reduced to 7.3 [mV].

In Example 1, although the crosstalk about the signal line $600_1$ and the signal line $600_2$ was described and it is clear that crosstalk noise generated in other wiring in the out-of-plane direction can also be reduced.

Example 2

Next, simulation results obtained in the case where the pitch between the solder balls 400 and 400 and the height of the solder balls 400 in Example 1 were changed in the printed circuit board 100 shown in FIG. 1 are described as Example 2.

In the printed circuit board 100 in Example 2, the length H1 of the via conductors 340 of the package substrate 301 was set to 0.6 [mm], the pitch D of the solder balls 400 of the BGA was set to 0.4 [mm], and the height H2 of the solder balls 400 was set to 0.24 [mm].

Figure 6:
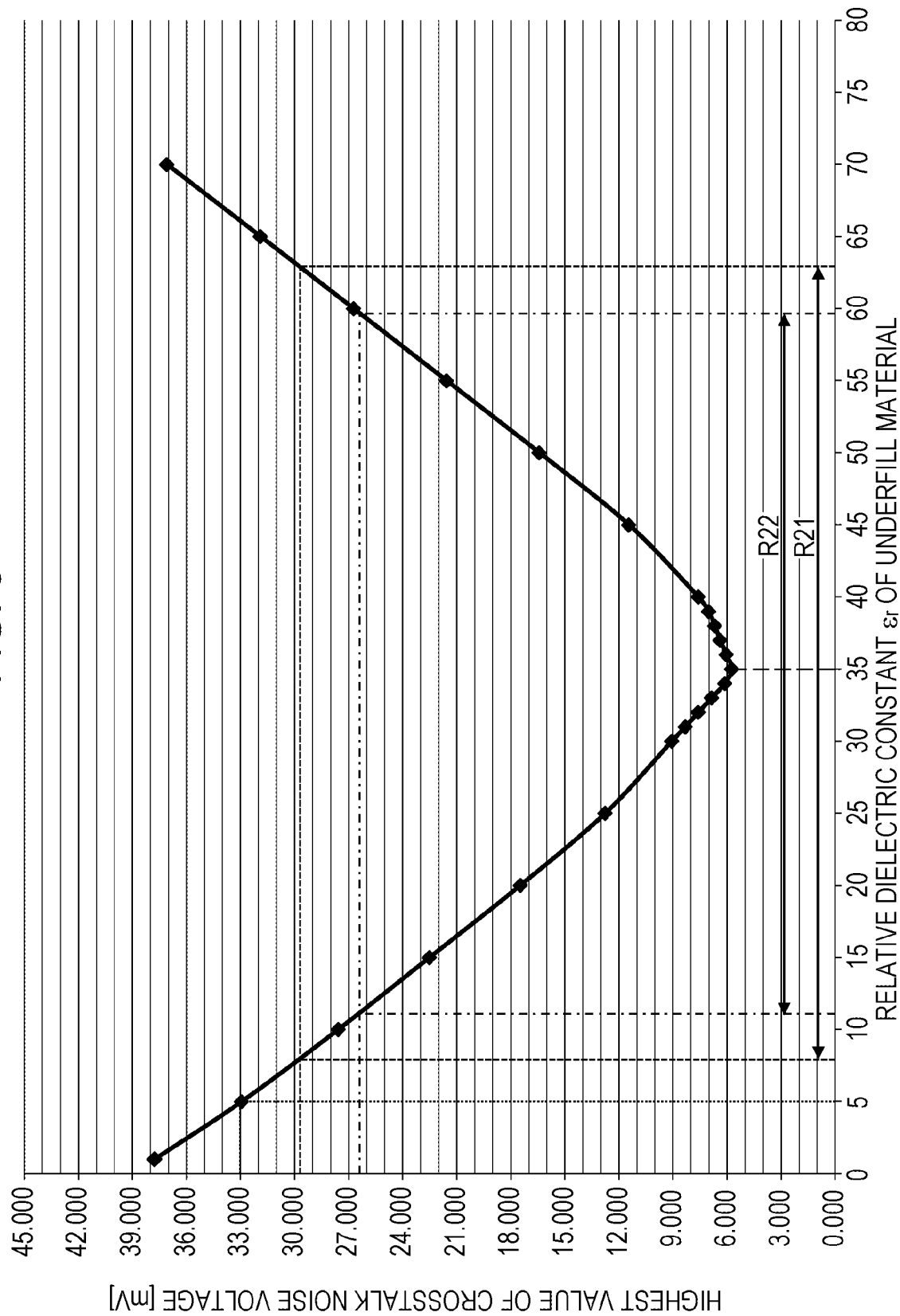
FIG. 6 is a graph showing the relationship between the relative dielectric constant of an underfill material and the absolute value of the highest fluctuation voltage of a crosstalk noise voltage generated in signal lines in Example 2.

FIG. 6 is a graph showing the simulation results of the relative dielectric constant of the underfill material 500 and the absolute value of the highest fluctuation voltage of a crosstalk noise voltage generated in the signal line $600_2$ in Example 2. The simulation was the same as the simulation of Example 1.

FIG. 6 shows that the crosstalk noise voltage at the highest value (relative dielectric constant of 5) of the relative dielectric constant of generally used underfill materials is 32.9 [mV]. A range R21 of the relative dielectric constant of the underfill material 500 in which the noise reduction effect is 10% or more to the crosstalk noise voltage of 32.9 [mV], i.e., the crosstalk noise voltage is 29.6 [mV], is 8.2 or more and 62.8 or less.

FIG. 6 also shows that a range R22 of the relative dielectric constant of the underfill material 500 in which the noise reduction effect is 20% or more to generally used underfill materials, i.e., the crosstalk voltage is 26.3 [mV], is 11.1 or more and 59.6 or less.

FIG. 6 further shows that the relative dielectric constant of the underfill material 500 at which the noise reduction effect was the highest in Example 2 was 35.

Figure 7:
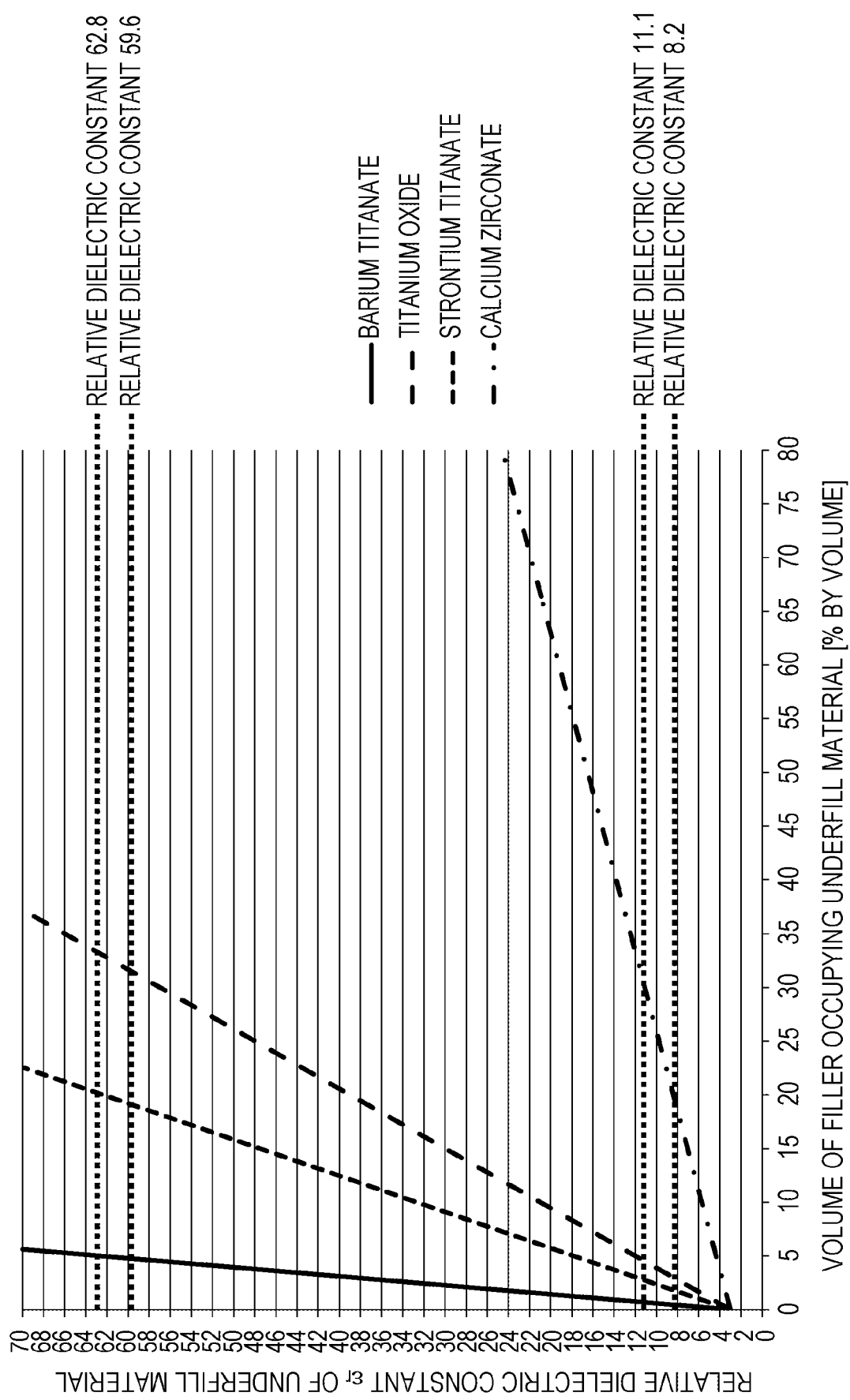
FIG. 7 is a graph showing the relative dielectric constant of the underfill material to the volume ratio of a high dielectric constant material in Example 2.

FIG. 7 is a graph showing the relative dielectric constant of the underfill material 500 to the volume ratio of the high dielectric constant materials 502 in the underfill material 500 in Example 2 similarly as Example 1. FIG. 7 shows the case where epoxy resin (relative dielectric constant of 3) was used for the base material 501 and a simple substance of barium titanate, titanium oxide, strontium titanate, calcium zirconate was mixed as the high dielectric constant materials 502 into the base material 501.

An example of a composition which realizes the range R21 (8.2 or more and 62.8 or less) of the relative dielectric constant of the underfill material 500 was as follows from the results of FIG. 7. In this case, epoxy resin (relative dielectric constant of 3) was used for the base material 501 and any one of barium titanate, titanium oxide, strontium titanate, and calcium zirconate was used for the high dielectric constant materials 502 to be mixed.

The volume ratio of barium titanate is 0.4% or more and 5% or less.
  The volume ratio of titanium oxide is 2.9% or more and 33.2% or less.
  The volume ratio of strontium titanate is 1.8% or more and 20.1% or less.
  The volume ratio of calcium zirconate is 19.3% or more.

An example of a composition which realizes the range R22 (11.1 or more and 59.6 or less) of the relative dielectric constant of the underfill material 500 having a further noise reduction effect (20% or more noise reduction as compared with generally used underfill materials) was as follows. In this case, epoxy resin (relative dielectric constant of 3) was used for the base material 501 and any one of barium titanate, titanium oxide, strontium titanate, and calcium zirconate was used for the high dielectric constant materials 502 to be mixed.

The volume ratio of barium titanate is 0.7% or more and 4.7% or less.

The volume ratio of titanium oxide is 4.5% or more and 31.4% or less.

The volume ratio of strontium titanate is 2.7% or more and 19.1% or less.

The volume ratio of calcium zirconate is 30% or more.

From FIG. 7, as the composition of the underfill material 500 (relative dielectric constant of 35) having the highest noise reduction effect in the structure of Example 1, the following compositions 1 to 3 are mentioned.

Composition 1:
Barium titanate (relative dielectric constant of 1200) 2.7% by volume
Epoxy resin (relative dielectric constant of 3) 96.3% by volume
Carbon black 1% by volume or less Composition 2:
Titanium oxide (relative dielectric constant of 183) 17.8% by volume
Epoxy resin (relative dielectric constant of 3) 81.2% by volume
Carbon black 1% by volume or less Composition 3:
Strontium titanate (relative dielectric constant of 300) 10.8% by volume
Epoxy resin (relative dielectric constant of 3) 81.2% by volume
Carbon black 1% by volume or less By filling (injecting) the underfill material 500 having a relative dielectric constant of 35 represented by these compositions 1 to 3 between and around the solder balls 400, crosstalk noise generated in the via conductors 340 and the solder balls 400 can be minimized.

Thus, crosstalk noise of a negative voltage generated due to inductive coupling between the solder balls 400 and 400 is canceled by the crosstalk noise of a positive voltage generated due to capacitive coupling between the solder balls 400 and 400 by the underfill material 500. Therefore, the underfill material 500 can reduce the crosstalk noise generated between the solder balls 400 and 400, specifically, between the wiring 600 and 600 in the out-of-plane direction, can be reduced without increasing the mounting area.

By using epoxy resin as the main component for the base material 501, the bonding between the solder balls 400 and the pads 220 and 320 can be effectively reinforced.

In particular, due to the fact that the high dielectric constant materials 502 contain barium titanate as the main component, the volume ratio of the high dielectric constant materials 502 to the underfill material 500 can be made small. Therefore, a reduction in the effect of reinforcing the bonding by the base material 501 can be suppressed.

Next, simulation was performed under the conditions where the relative dielectric constant of the underfill material 500 to be used in Example 2 was set to 35 and the relative dielectric constant of the underfill material was set to 5 as Comparative Example 2.

Figure 8:
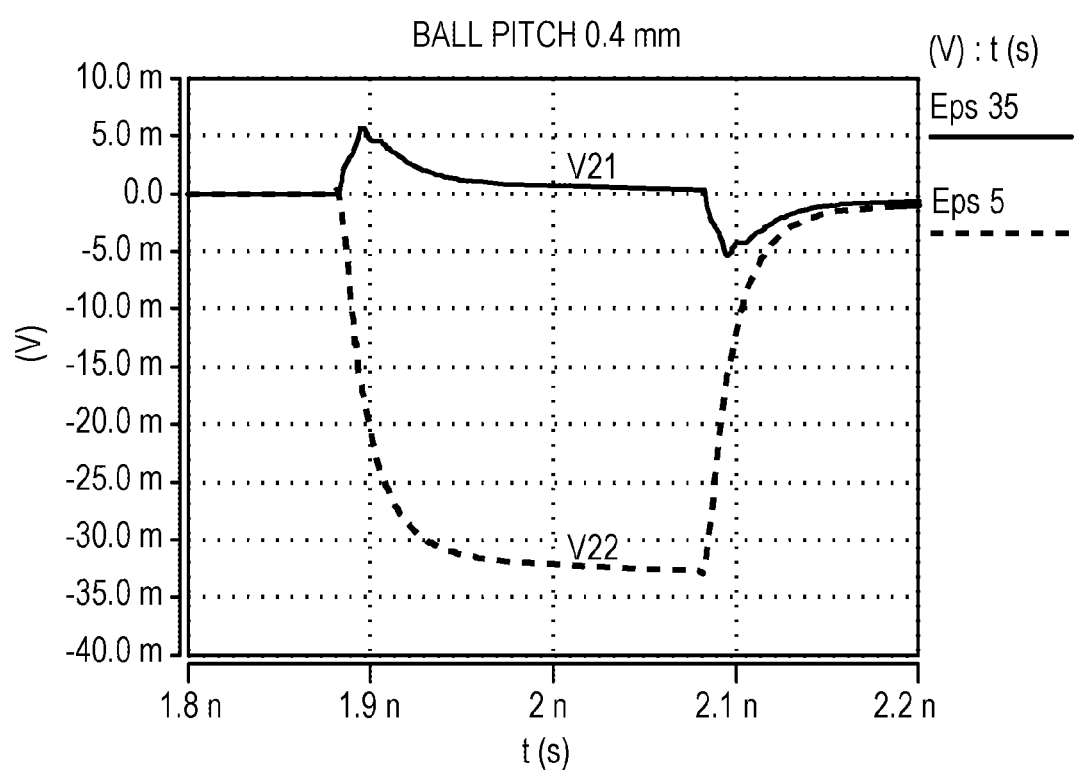
FIG. 8 is a voltage waveform chart showing crosstalk voltages in Example 2 and Comparative Example 2.

In the printed circuit board 100 of Example 2 and a printed circuit board of Comparative Example 2, a step pulse having a slew rate of 7.5 [V/nsec] and a voltage of 1.5 [V] was applied immediately before the via conductor $341_1$ with respect to the signal line $600_1$ of the package substrate 301. The crosstalk noise voltage on the wiring in the printed wiring board immediately after the solder ball $400_2$ in the signal line $600_2$ at this time is shown in FIG. 8. FIG. 8 is a voltage waveform chart showing the crosstalk noise voltages in Example 2 and Comparative Example 2. The solid line V21 represents the crosstalk noise voltage in Example 2 and the dotted lines V22 represent the crosstalk noise voltage in Comparative Example 2. In Comparative Example 2, a crosstalk noise voltage of 32.9 [mV] is generated but, in Example 2 in which the underfill material 500 having a relative dielectric constant of 30 was injected, the crosstalk noise voltage can be reduced to 5.7 [mV].

In Example 2, although the crosstalk about the signal line $600_1$ and the signal line $600_2$ was described and it is clear that crosstalk noise generated in other wiring in the out-of-plane direction can also be reduced.

Example 3

Next, simulation results obtained in the case where the pitch between the solder balls 400 and 400 and the height of the solder balls 400 in Examples 1 and 2 were changed in the printed circuit board 100 shown in FIG. 1 is described as Example 3.

In the printed circuit board 100 in Example 3, the length H1 of the via conductor 340 of the package substrate 301 was set to 0.6 [mm], the pitch D of the solder balls 400 of the BGA was set to 0.3 [mm], and the height H2 of the solder balls 400 was set to 0.18 [mm].

Figure 9:
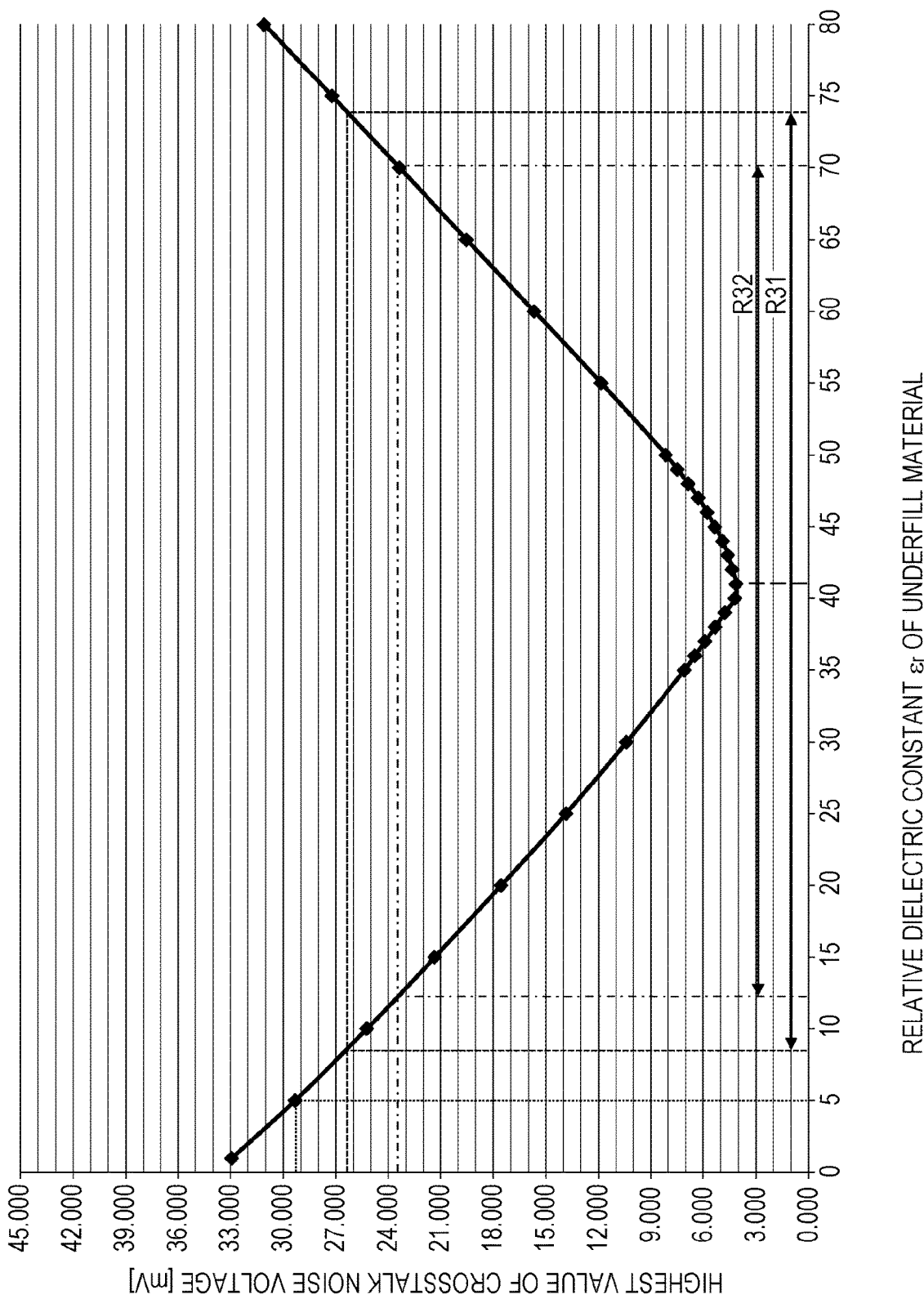
FIG. 9 is a graph showing the relationship between the relative dielectric constant of an underfill material and the absolute value of the highest fluctuation voltage of a crosstalk noise voltage generated in signal lines in Example 3.

FIG. 9 is a graph showing the simulation results of the relative dielectric constant of the underfill material 500 and the absolute value of the highest fluctuation voltage of a crosstalk noise voltage generated in the signal line $600_2$ in Example 3. The simulation was the same as the simulation of Example 1.

FIG. 9 shows that a range R31 of the relative dielectric constant of the underfill material 500 in which the noise reduction effect is 10% or more to the highest value (relative dielectric constant of 5) of the relative dielectric constant of generally used underfill materials is 8.6 or more and 73.9 or less.

FIG. 9 also shows that a range R32 of the relative dielectric constant of the underfill material 500 in which the noise reduction effect is 20% or more to generally used underfill materials is 12.1 or more and 70.1 or less.

FIG. 9 further shows that the relative dielectric constant of the underfill material 500 at which the noise reduction effect was the highest in Example 3 was 41.

Figure 10:
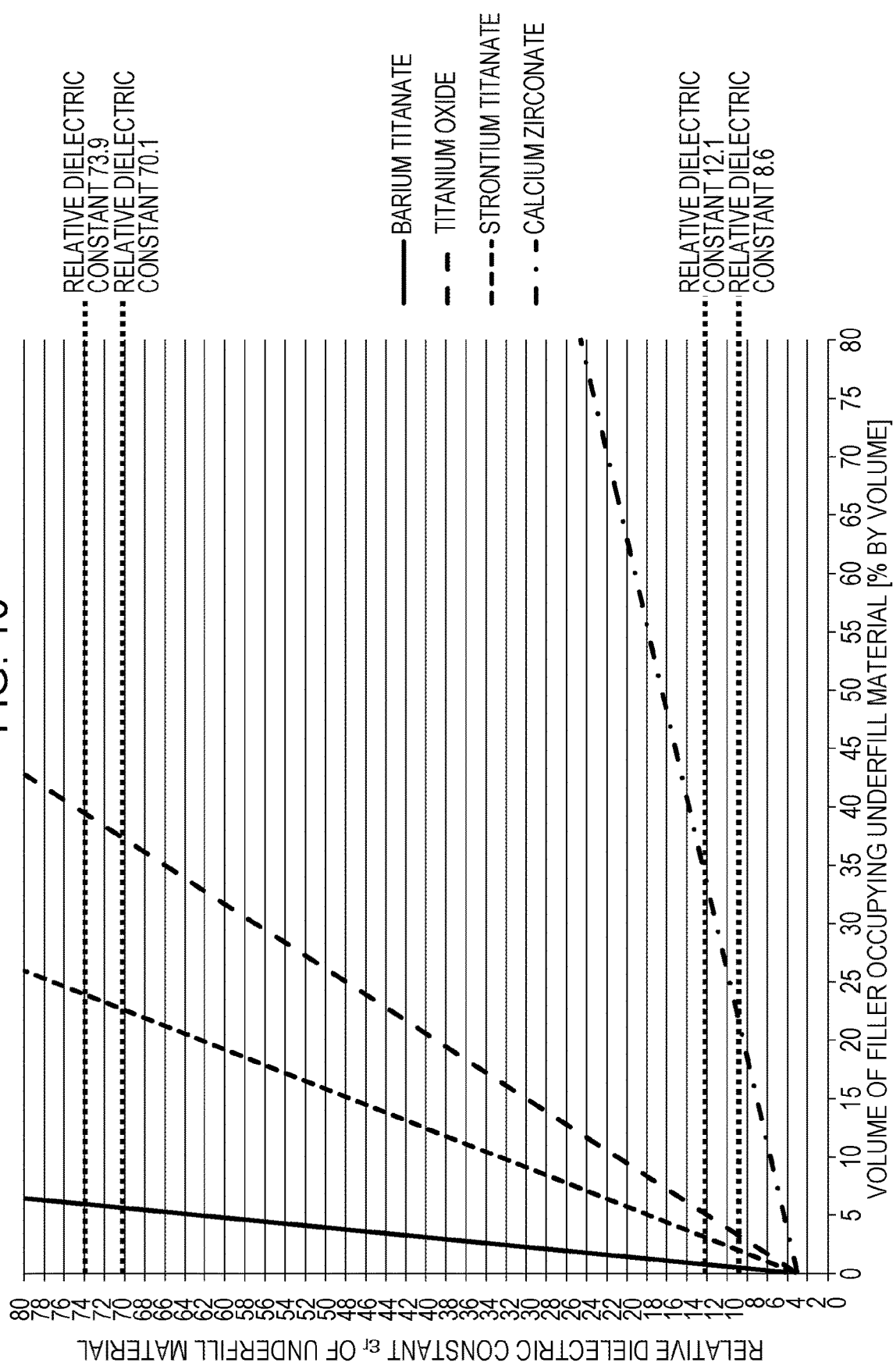
FIG. 10 is a graph showing the relative dielectric constant of the underfill material to the volume ratio of a high dielectric constant material in Example 3.

FIG. 10 is a graph showing the relative dielectric constant of the underfill material 500 to the volume ratio of the high dielectric constant materials 502 in the underfill material 500 in an aspect of Example 3 similarly as Example 1. FIG. 10 shows the case where epoxy resin (relative dielectric constant of 3) was used for the base material 501 and a simple substance of barium titanate, titanium oxide, strontium titanate, calcium zirconate was mixed as the high dielectric constant materials 502 into the base material 501.

An example of a composition which realizes the range R31 (8.6 or more and 73.9 or less) of the relative dielectric constant of the underfill material 500 was as follows from the results of FIG. 10. In this case, epoxy resin (relative dielectric constant of 3) was used for the base material 501 and any one of barium titanate, titanium oxide, strontium titanate, and calcium zirconate was used for the high dielectric constant materials 502 to be mixed.

The volume ratio of barium titanate is 0.5% or more and 5.9% or less.

The volume ratio of titanium oxide is 3.1% or more and 39.4% or less.

The volume ratio of strontium titanate is 1.9% or more and 23.9% or less.

The volume ratio of calcium zirconate is 20.7% or more.

An example of the composition which realizes the range R32 (12.1 or more and 70.1 or less) of the relative dielectric constant of the underfill material 500 having a further noise reduction effect (20% or more noise reduction as compared with generally used underfill materials) was as follows. In this case, epoxy resin (relative dielectric constant of 3) was used for the base material 501 and any one of barium titanate, titanium oxide, strontium titanate, and calcium zirconate was used for the high dielectric constant materials 502 to be mixed.

The volume ratio of barium titanate is 0.8% or more and 5.6% or less.

The volume ratio of titanium oxide is 5.1% or more and 37.3% or less.

The volume ratio of strontium titanate is 3.1% or more and 22.6% or less.

The volume ratio of calcium zirconate is 33.7% or more.

From FIG. 10, as the composition of the underfill material 500 (relative dielectric constant of 28.5) at which the noise reduction effect was the highest in the structure of Example 1, the following compositions 1 to 3 are mentioned.

Composition 1:
  Barium titanate (relative dielectric constant of 1200) 3.2% by volume
  Epoxy resin (relative dielectric constant of 3) 95.8% by volume
  Carbon black 1% by volume or less Composition 2:
  Titanium oxide (relative dielectric constant of 183) 21.1% by volume
  Epoxy resin (relative dielectric constant of 3) 77.9% by volume
  Carbon black 1% by volume or less Composition 3:
  Strontium titanate (relative dielectric constant of 300) 12.8% by volume
  Epoxy resin (relative dielectric constant of 3) 86.2% by volume
  Carbon black 1% by volume or less By filling (injecting) the underfill material 500 having a relative dielectric constant of 41 represented by these compositions 1 to 3 between and around the solder balls 400, crosstalk noise generated in the via conductors 340 and the solder balls 400 can be minimized.

Thus, the crosstalk noise of a negative voltage generated due to inductive coupling between the solder balls 400 and 400 is canceled by the crosstalk noise of a positive voltage generated due to capacitive coupling between the solder balls 400 and 400 by the underfill material 500. Therefore, the underfill material 500 can reduce the crosstalk noise generated between the solder balls 400 and 400, specifically, between the wiring 600 and 600 in the out-of-plane direction, can be reduced without increasing the mounting area.

By using epoxy resin as the main component for the base material 501, the bonding between the solder balls 400 and the pads 220 and 320 can be effectively reinforced.

In particular, due to the fact that the high dielectric constant materials 502 contain barium titanate as the main component, the volume ratio of the high dielectric constant materials 502 to the underfill material 500 can be made small. Therefore, a reduction in the effect of reinforcing the bonding by the base material 501 can be suppressed.

Next, simulation was performed under the conditions where the relative dielectric constant of the underfill material 500 to be used in Example 3 was set to 41 and the relative dielectric constant of the underfill material was set to 5 as Comparative Example 3.

Figure 11:
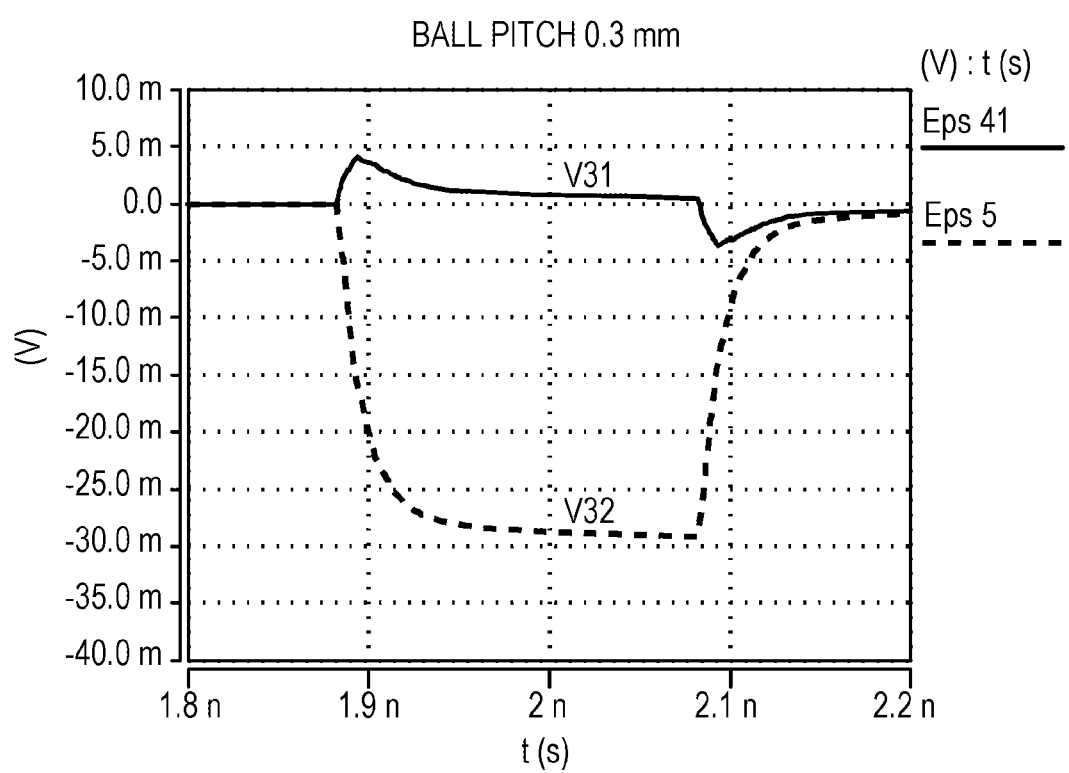
FIG. 11 is a voltage waveform chart showing crosstalk voltages in Example 3 and Comparative Example 3.

In the printed circuit board 100 of Example 3 and a printed circuit board of Comparative Example 3, a step pulse having a slew rate of 7.5 [V/nsec] and a voltage 1.5 [V] was applied immediately before the via conductor $341_1$ with respect to the signal line $600_1$ of the package substrate 301. The crosstalk noise voltage on the wiring in the printed wiring board immediately after the solder ball $400_2$ in the signal line $600_2$ at this time is shown in FIG. 11. FIG. 11 is a voltage waveform chart showing the crosstalk noise voltages in Example 3 and Comparative Example 3. The solid line V31 represents the crosstalk noise voltage in Example 3 and the dotted lines V32 represent the crosstalk noise voltage in Comparative Example 3. In Comparative Example 3, a crosstalk noise voltage of 29.3 [mV] is generated but, in Example 3 in which the underfill material 500 having a relative dielectric constant of 41 was injected, the crosstalk noise voltage can be reduced to 4.1 [mV].

In Example 3, although the crosstalk about the signal line 6001 and the signal line $600_2$ was described and it is clear that crosstalk noise generated in other wiring in the out-of-plane direction can also be reduced.

Examples 1 to 3 are described above and are summarized as follows. The pitch D of the solder balls 400 of a BGA is set to 0.3 [mm] to 0.5 [mm]. A range of the relative dielectric constant of the underfill material 500 in which the noise reduction effect is 10% or more to the highest value (relative dielectric constant of 5) of the relative dielectric constant of commonly generally used underfill materials is 8.6 or more and 54.4 or less. A range of the relative dielectric constant of the underfill material 500 in which the noise reduction effect is 20% or more to the highest (relative dielectric constant of 5) of the relative dielectric constant of commonly generally used underfill materials is 12.1 or more and 51.7 or less.

The present invention is not limited to the embodiment described above and can be altered in various manners within the technical concept of the present invention.

In the embodiment and Examples, the description is given in the case where the semiconductor device is a BGA type semiconductor package. However, the present invention is not limited thereto and may be a LGA (Land Grid Array) type semiconductor package, for example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method for manufacturing a printed circuit board, comprising:
   connecting a plurality of first pads of a semiconductor device to a plurality of second pads of a printed wiring board respectively using a plurality of connection terminals; and
   filling an underfill material that has a relative dielectric constant of 8.6 or more and 54.4 or less between and around the plurality of connection terminals.

2. The method according to claim 1, wherein the plurality of first pads includes a plurality of signal connection terminals and further includes a plurality of ground terminals whose number is smaller than number of the plurality of signal connection terminals.

3. The method according to claim 1, wherein the underfill material has a relative dielectric constant of 12.1 or more and 51.7 or less.

4. The method according to claim 1, wherein the underfill material includes a base material and a filler, and the filler is made of a high dielectric constant material that has a dielectric constant higher than that of the base material.

5. The method according to claim 4,
wherein the base material contains epoxy resin as a main component, and
wherein the filler contains at least one of barium titanate, titanium oxide, strontium titanate, and calcium zirconate.

6. The method according to claim 5, wherein the plurality of connection terminals is a plurality of solder balls.

7. A printed circuit board, comprising:
a semiconductor device including a semiconductor chip, the semiconductor device package having a surface on which a plurality of first pads is provided;
a printed wiring board that has a surface on which a plurality of second pads is provided, the surface facing the surface on which the plurality of first pads is provided a second surface on which a plurality of second pads is provided, the first surface and the second surface facing each other;
a plurality of connection terminals for connecting the plurality of first pads and the plurality of second pads that respectively correspond to each other; and
an underfill material filled between the plurality of connection terminals,
wherein the plurality of connection terminals includes a plurality of signal connection terminals and further includes a plurality of ground terminals whose number is smaller than number of the plurality of signal connection terminals, and
wherein the underfill material has a relative dielectric constant of 8.6 or more and 54.4 or less.

8. The printed circuit board according to claim 7,
wherein the underfill material has a relative dielectric constant of 12.1 or more and 51.7 or less.

9. The printed circuit board according to claim 7, wherein the underfill material includes a base material and a filler, and the filler is made of a high dielectric constant material that has a dielectric constant higher than that of the base material.

10. The printed circuit board according to claim 9,
wherein the base material contains epoxy resin as a main component, and
wherein the filler contains at least one of barium titanate, titanium oxide, strontium titanate, and calcium zirconate.

11. The printed circuit board according to claim 10, wherein a main component of the filler is barium titanate.

12. The printed circuit board according to claim 7, wherein the semiconductor device package includes a plurality of via conductors for electrically connecting the signal terminals of the semiconductor chip to the first pads.

13. An electronic equipment comprising the printed circuit board according to claim 7.

14. A printed circuit board, comprising:
a printed wiring board;
a semiconductor device mounted on the printed wiring board;
connection terminals which connect the printed wiring board and the semiconductor device,
wherein the connection terminals include plural signal connection terminals for transmitting signals between the semiconductor device and the printed wiring board; and
an underfill material which is disposed between adjacent signal connection terminals that are next to each other,
wherein the underfill material has a relative dielectric constant of 8.6 or more and 54.4 or less.

15. The printed circuit board according to claim 14, wherein the underfill material has a relative dielectric constant of 12.1 or more and 51.7 or less.

16. The printed circuit board according to claim 14, wherein the underfill material has a base material and a high dielectric constant material having a dielectric constant higher than a dielectric constant of the base material.

17. The printed circuit board according to claim 16, wherein the base material contains epoxy resin as a main component and the high dielectric constant material contains at least one of barium titanate, strontium titanate, titanium oxide, and calcium zirconate.

18. The printed circuit board according to claim 14, wherein the plurality of connection terminals contain solder.

19. An electronic equipment comprising the printed circuit board according to claim 14.

* * * * *